United States Patent
Liu et al.

(10) Patent No.: US 12,456,667 B2
(45) Date of Patent: Oct. 28, 2025

(54) MANUFACTURING METHOD OF SEMICONDUCTOR PACKAGING MEMBER, SEMICONDUCTOR PACKAGING MEMBER AND MOUNTING METHOD THEREOF

(71) Applicant: JCET SEMICONDUCTOR (SUQIAN) CO., LTD., Suqian (CN)

(72) Inventors: Kai Liu, Suqian (CN); Sai Xu, Suqian (CN)

(73) Assignee: JCET SEMICONDUCTOR (SUQIAN) CO., LTD., Suqian (CN)

( * ) Notice: Subject to any disclaimer, the term of this patent is extended or adjusted under 35 U.S.C. 154(b) by 425 days.

(21) Appl. No.: 18/099,933

(22) Filed: Jan. 21, 2023

(65) Prior Publication Data
US 2023/0411256 A1   Dec. 21, 2023

(30) Foreign Application Priority Data
Jun. 20, 2022   (CN) .......................... 202210700674.7

(51) Int. Cl.
*H01L 23/495* (2006.01)
*H01L 21/48* (2006.01)
(Continued)

(52) U.S. Cl.
CPC .... *H01L 23/49582* (2013.01); *H01L 21/4842* (2013.01); *H01L 21/56* (2013.01); *H01L 23/3107* (2013.01); *H01L 23/49513* (2013.01); *H01L 24/32* (2013.01); *H01L 24/48* (2013.01); *H01L 24/73* (2013.01); *H01L 24/83* (2013.01);
(Continued)

(58) Field of Classification Search
CPC ........... H01L 23/49582; H01L 21/4842; H01L 21/56; H01L 23/3107; H01L 23/49513; H01L 24/32; H01L 24/48; H01L 24/73; H01L 24/83; H01L 24/85; H01L 24/92; H01L 2224/32245; H01L 2224/48245; H01L 2224/73265; H01L 2224/83801; H01L 2224/85; H01L 2224/92247; H01L 21/561; H01L 23/49548; H01L 2224/05554; H01L 2224/48091;
(Continued)

(56) References Cited

U.S. PATENT DOCUMENTS

| | | | |
|---|---|---|---|
| 2006/0138615 A1* | 6/2006 | Sato | H01L 23/49582 257/667 |
| 2018/0247883 A1* | 8/2018 | Imori | H01L 23/49537 |
| 2019/0148271 A1* | 5/2019 | Rodriguez | H01L 21/4842 257/676 |

* cited by examiner

Primary Examiner — Tong-Ho Kim
(74) Attorney, Agent, or Firm — MUNCY, GEISSLER, OLDS & LOWE, P.C.

(57) ABSTRACT

The present invention provides a manufacturing method of a semiconductor packaging member, a semiconductor packaging member and a mounting method thereof. The manufacturing method of the semiconductor packaging member includes the following steps of: forming a through hole running through vertically in an outer pin of a lead frame, and disposing a tin block in the through hole; and cutting the lead frame to at least partially expose a side of the tin block located on a cutting surface. Subsequently, when the semiconductor packaging member is soldered on a circuit board, the tin block is melted to realize all-position soldering from a front surface to side surfaces and a back surface, and even the interior of the outer pin, thereby improving the reliability of a circuit, and effectively improving the stability and the pass rate in AOI detection.

13 Claims, 4 Drawing Sheets

(51) Int. Cl.
*H01L 21/56* (2006.01)
*H01L 23/00* (2006.01)
*H01L 23/31* (2006.01)

(52) U.S. Cl.
CPC .............. *H01L 24/85* (2013.01); *H01L 24/92* (2013.01); *H01L 2224/32245* (2013.01); *H01L 2224/48245* (2013.01); *H01L 2224/73265* (2013.01); *H01L 2224/83801* (2013.01); *H01L 2224/85* (2013.01); *H01L 2224/92247* (2013.01)

(58) Field of Classification Search
CPC ....... H01L 2224/48247; H01L 2224/97; H01L 2924/181; H01L 21/4821; H01L 23/49541
USPC ........................................................ 257/676
See application file for complete search history.

MANUFACTURING METHOD OF SEMICONDUCTOR PACKAGING MEMBER, SEMICONDUCTOR PACKAGING MEMBER AND MOUNTING METHOD THEREOF

TECHNICAL FIELD

The present invention relates to the field of semiconductor packaging, and in particular to a manufacturing method of a semiconductor packaging member, a semiconductor packaging member and a mounting method thereof.

BACKGROUND

As shown in FIG. 1, in the traditional no-lead packaging, a base island 1' and part of a back surface of a pin 2' exposed from a plastic package 7' may be electroplated with tin in an electroplating process to form a tin-plated layer 9'. After a single semiconductor packaging member 20' is formed by cutting, a cutting surface of the pin 2' is exposed from the plastic package 7', and is a bare copper surface. When the semiconductor packaging member 20' is soldered on a circuit board 30', the bottom mounting surface with the tin-plated layer 9' has a certain amount of tin, while the cutting surface without tinning has almost no tin, resulting in an insufficient solder around the pin, and failing to satisfy solder requirements of automobile products and AOI detection standards.

In view of this, in order to solve the above problems, it is necessary to provide a manufacturing method of a semiconductor packaging member, a semiconductor packaging member and a mounting method thereof.

SUMMARY

An object of the present invention is to provide a manufacturing method of a semiconductor packaging member, a semiconductor packaging member and a mounting method thereof.

In order to achieve the above object of the present invention, the following technical solutions are adopted by the present invention: A manufacturing method of a semiconductor packaging member, comprising the following steps of:

forming a through hole running through vertically in an outer pin of a lead frame, and disposing a tin block in the through hole; and cutting the lead frame to at least partially expose a side of the tin block located on a cutting surface.

A further improved technical solution of the present invention is described below, the through hole comprises a groove formed by sinking from a front surface to a back surface of the outer pin and a via hole communicating the groove with the back surface of the outer pin; the tin block comprises a first tin block located in the groove and a second tin block located in the via hole; and in the semiconductor packaging member, a side of the first tin block located on the cutting surface is exposed, or a side of each of the first tin block and the second tin block located on the cutting surface is exposed.

A further improved technical solution of the present invention is described below, forming the through hole running through vertically in the outer pin of the lead frame, and disposing the tin block in the through hole specifically comprises the following steps of:

forming the groove by sinking from the front surface to the back surface of the outer pin, and disposing the first tin block in the groove;

mounting a chip on a base island of the lead frame, and performing wire bonding between the chip and an inner pin;

plastic-packaging the wire-bonded lead frame; and forming the via hole communicated with the groove from the back surface of the outer pin, and disposing the second tin block in the via hole.

A further improved technical solution of the present invention is described below, disposing the first tin block in the groove specifically refers to forming the first tin block by reflowing solder paste after the groove is filled with the solder paste.

A further improved technical solution of the present invention is described below, mounting the chip on the base island of the lead frame refers to mounting the chip on the base island with the solder paste; and disposing the first tin block in the groove and mounting the chip on the base island of the lead frame specifically comprise:

filling the groove with the solder paste while applying the solder paste on the base island; and reflowing the solder paste after mounting the chip on the base island, and forming the first tin block in the groove while mounting the chip on the base island.

A further improved technical solution of the present invention is described below, disposing the second tin block in the via hole specifically refers to forming the second tin block by reflowing solder paste after the via hole is filled with the solder paste.

A further improved technical solution of the present invention is described below, the via hole is located between the groove and the back surface of the outer pin.

A further improved technical solution of the present invention is described below, forming the groove by sinking from the front surface to the back surface of the outer pin specifically refers to forming the groove by sinking from the front surface of the outer pin and a front surface of a pin connecting rib connected to the outer pin to the back surface.

A further improved technical solution of the present invention is described below, the grooves on two opposing outer pins in two adjacent lead frame units on the lead frame are communicated with each other.

A further improved technical solution of the present invention is described below, the groove is a rectangular groove or an arc-shaped groove.

A further improved technical solution of the present invention is described below, after disposing the tin block in the through hole and before cutting the lead frame, the manufacturing method of a semiconductor packaging member further comprises the following step of: forming a semifinished product to be cut by forming a tin-plated layer in an exposed region on a back surface of the lead frame.

In order to achieve the above object of the present invention, the present invention further provides a semiconductor packaging member. The semiconductor packaging member is manufactured by the manufacturing method thereof described above.

In order to achieve the above object of the present invention, the present invention further provides a semiconductor packaging member. comprising a lead frame, the lead frame is provided with a base island and pins located around the base island, and the pin includes an inner pin and an outer pin; and a through hole running through vertically is formed in the outer pin, the semiconductor packaging member further comprises a tin block disposed in the through hole, and a side of the tin block away from the inner pin is at least partially exposed.

A further improved technical solution of the present invention is described below, the semiconductor packaging member further comprising a chip mounted on the base island, a bonding wire connected between the chip and the inner pin, a plastic package body for packaging the chip and the bonding wire, and a tin-plated layer formed on the back surface of the base island and the back surface of the pin.

A further improved technical solution of the present invention is described below, the through hole comprises a groove formed by sinking from a front surface to a back surface of the outer pin and a via hole communicating the groove with the back surface of the outer pin, and the tin block comprises a first tin block located in the groove and a second tin block located in the via hole; and in the semiconductor packaging member, a side of the first tin block away from the inner pin is exposed, or a side of each of the first tin block and the second tin block away from the inner pin is exposed.

In order to achieve the above object of the present invention, the present invention further provides an mounting method of a semiconductor packaging member, comprising the following step of: soldering the semiconductor packaging member described above on a circuit board, wherein a tin block on an outer pin is melted during soldering, part of the melted tin block on a side of the outer pin away from an inner pin is connected to a tin-plated layer on a back surface of the outer pin, and the remaining part of the melted tin block is connected to the tin-plated layer on the back surface of the outer pin via the via hole.

The present invention has the following technical effects. In the manufacturing method of a semiconductor packaging member of the present invention, the through hole is formed in the outer pin of the lead frame, and the tin block is disposed in the through hole; and in addition, a side of the tin block located on a cutting surface is at least partially exposed after cutting. Subsequently, when the semiconductor packaging member is soldered on a circuit board, the tin block is melted to realize all-position soldering from a front surface to side surfaces and a back surface, and even the interior of the outer pin, thereby improving the reliability of a circuit, and effectively improving the stability and the pass rate in AOI detection.

DETAILED DESCRIPTION

The present invention will be described in detail below with reference to various embodiments shown in the accompanying drawings. Referring to FIGS. 2(a)-12, which show preferred embodiments of the present invention. However, it should be noted that these embodiments do not limit the present invention, and functions, methods or structural equivalents or substitutions made by those of ordinary skills in the art according to these embodiments shall all fall within the protection scope of the present invention.

Figure 7:
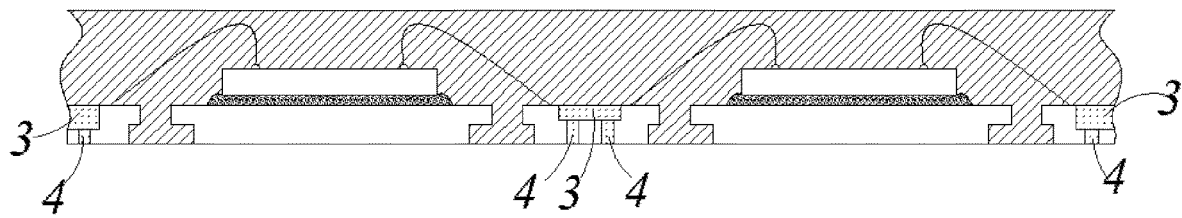
FIG. 7 is a section view of a second tin block formed in the via hole in FIG. 6.
Figure 8:
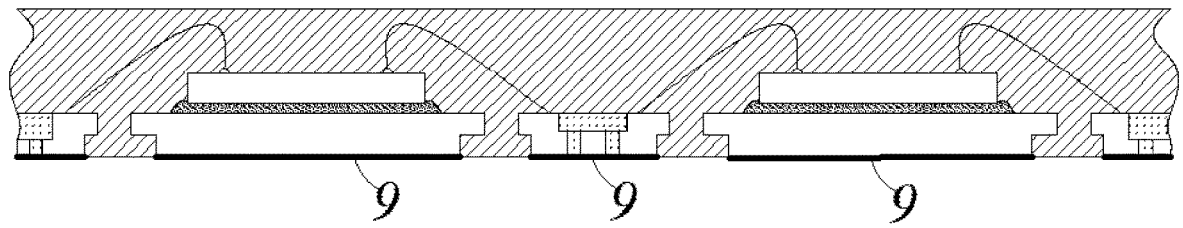
FIG. 8 is a section view of a semifinished product formed after a tin-plated layer is formed in an exposed region of the lead frame in FIG. 7.
Figure 9:
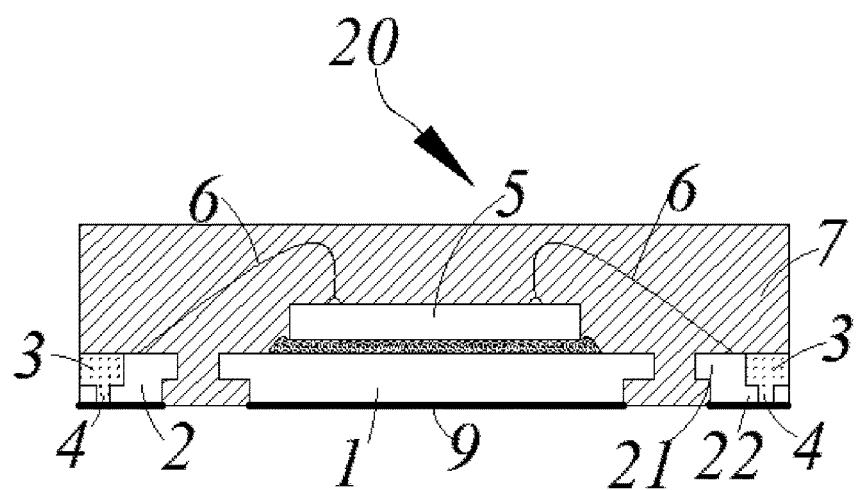
FIG. 9 is a section view of a semiconductor packaging member according to a first embodiment of the present invention formed by cutting the semifinished product in FIG. 8.

FIGS. 2(a) to 9 are flowcharts of steps of a manufacturing method of a semiconductor packaging member 20 according to a first embodiment of the present invention. The manufacturing method includes the following steps of:
    forming a through hole running through vertically in an outer pin 22 of the lead frame 10 shown in FIG. 2(a) and FIG. 2(b), and disposing a tin block in the through hole;
    as shown in FIG. 9, cutting the lead frame 10 to at least partially expose a side of the tin block located on a cutting surface.

In the manufacturing method of a semiconductor packaging member 20 of the present invention, the through hole is formed in the outer pin 22 of the lead frame 10, and the tin block 3 is disposed in the through hole; and in addition, a side of the tin block located on the cutting surface is at least partially exposed after cutting, that is, in the final semiconductor packaging member 20, the side of the tin block in the outer pin 22 which is located on the cutting surface is at least partially exposed. Subsequently, when the semiconductor packaging member 20 is soldered on a circuit board 30, the tin block is melted, and then, part of the melted tin block flows downward from the cutting surface to be agglomerated with a tin-plated layer 9 on the back surface of the pin 2, and the remaining part of the melted tin block is agglomerated with the tin-plated layer 9 on the back surface of the pin 2 along the through hole, such that all-position soldering from a front surface to side surfaces and a back surface, and even the interior of the outer pin 22 is realized, thereby improving the reliability of the circuit, and effectively improving the stability and the pass rate in AOI detection. Further, when the semiconductor packaging member 20 is soldered on the circuit board 30, the preset tin block can flow vertically to a pad of the circuit board 30 based on the principle of potential energy, thereby reducing power consumption and saving more energy.

Figure 1:
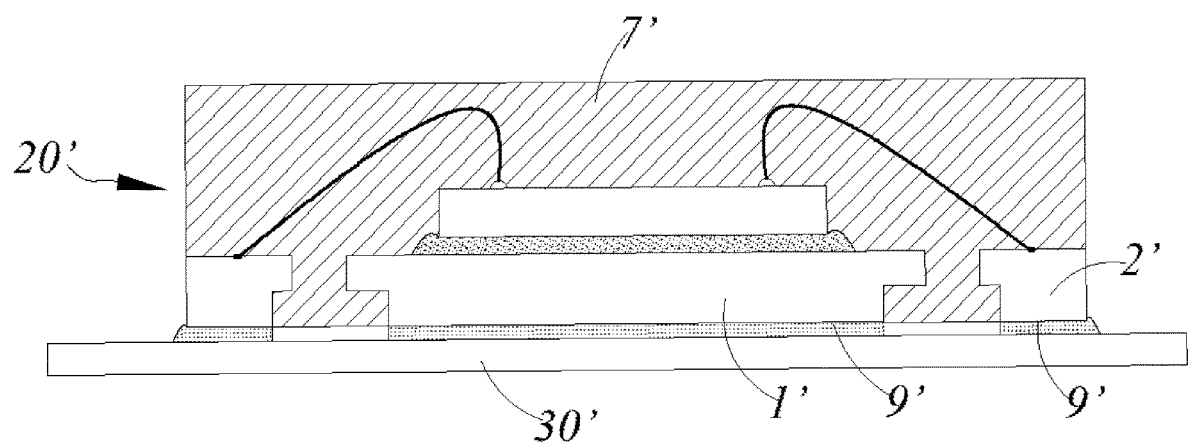
FIG. 1 is a schematic structural diagram of a semiconductor packaging member installed onto a circuit board in the prior art.
Figure 2A:
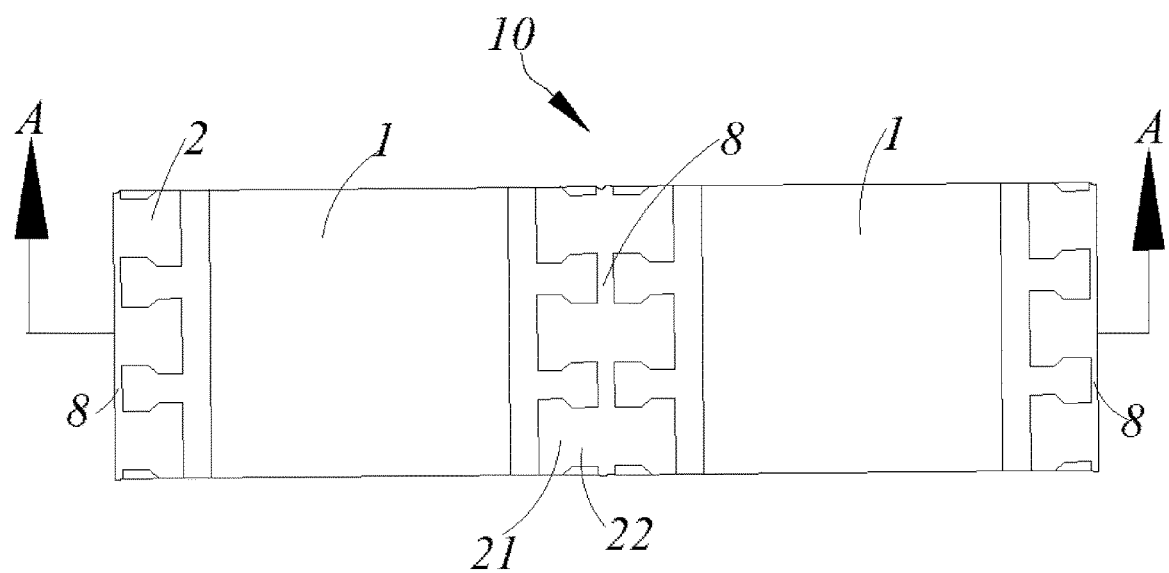
FIG. 2(a) is a top view of a lead frame.
Figure 2B:
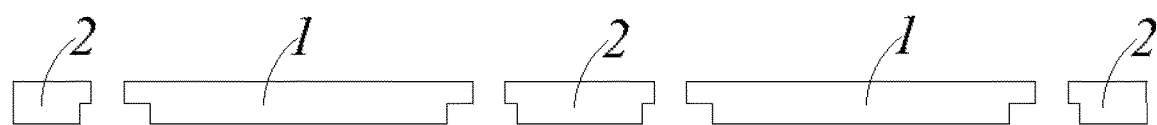
FIG. 2(b) is a section view of FIG. 2(a) at A-A.

Specifically, as shown in FIG. 2(a), the lead frame 10 comprises a plurality of lead frame units, each of the lead frame unit is provided with a base island 1 and pins 2 located around the base island 1, and the pin 2 includes an inner pin 21 and an outer pin 22. The outer pin 22 of the lead frame 10 described above refers to the outer pin 22 in each lead frame unit.

Figure 3:
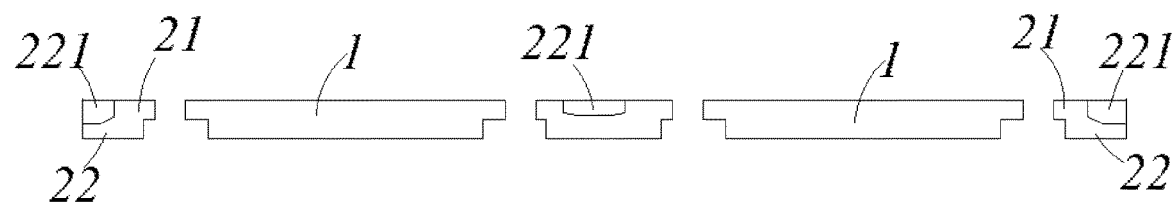
FIG. 3 is a section view of a groove formed in the lead frame in FIG. 2.
Figure 4A:
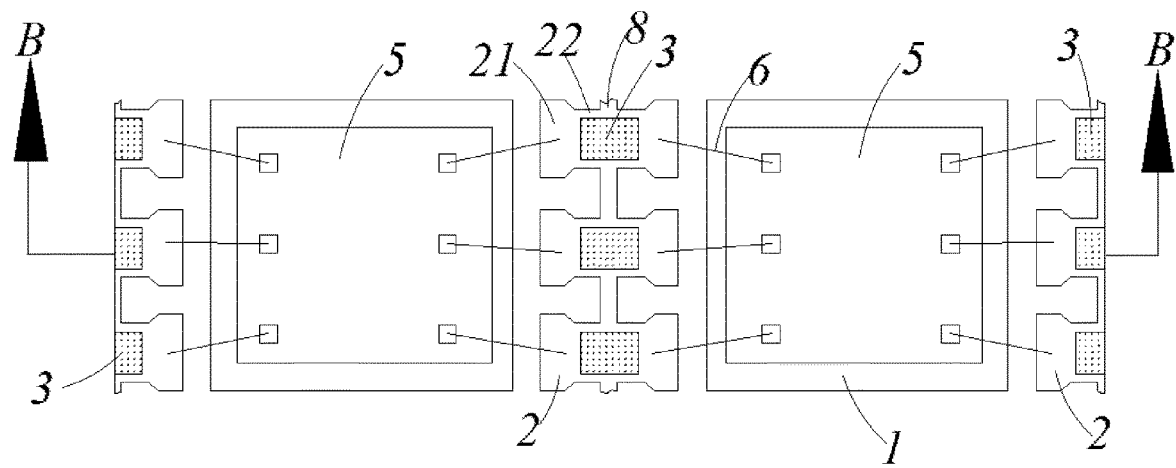
FIG. 4(a) is a schematic structural diagram that a first tin block is formed in the groove in FIG. 3, and the lead frame in FIG. 3 is mounted with a chip and weld-bonded.
Figure 5:
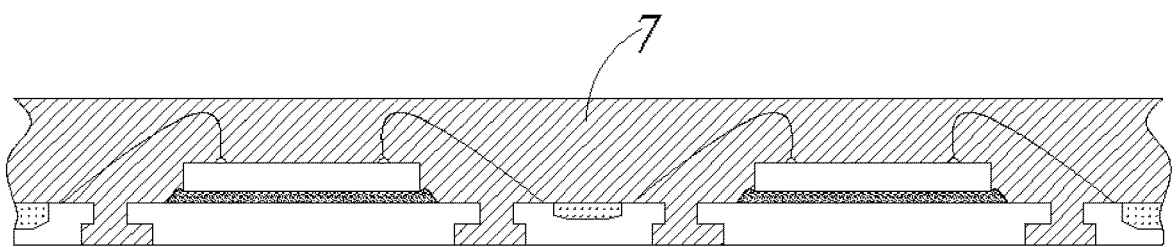
FIG. 5 is a section view of the plastic-packaged lead frame in FIG. 4.
Figure 6:
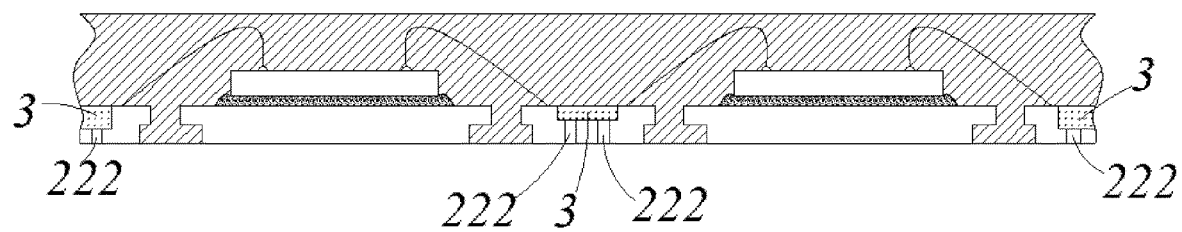
FIG. 6 is a section view of a via hole formed in an outer pin in FIG. 5.

In this embodiment, forming the through hole running through vertically in the outer pin 22 of the lead frame 10, and disposing the tin block in the through hole specifically comprises the following steps of:

as shown in FIG. 3, forming a groove 221 by sinking from the front surface to the back surface of the outer pin 22, and as shown in FIG. 4(a), disposing a first tin block 3 in the groove 221;

as shown in FIG. 4(a), mounting a chip 5 on the base island 1 of the lead frame 10, and performing wire bonding between the chip 5 and the inner pin 21;

as shown in FIG. 5, plastic-packaging the wire-bonded lead frame 10; and as shown in FIG. 6, forming a via hole 222 communicated with the groove 221 from the back surface of the outer pin 22, and as shown in FIG. 7, disposing a second tin block 4 in the via hole 222.

That is, the through hole includes the groove 221 formed by sinking from the front surface to the back surface of the outer pin 22, and the via hole 222 communicating the groove 221 with the back surface of the outer pin 22; and the tin block includes the first tin block 3 located in the groove 221, and the second tin block 4 located in the via hole 222. In the present invention, the groove 221 and the via hole 222 are formed separately to form the through hole, thereby facilitating disposing of the first tin block 3 and the second tin block 4 in the groove 221 and the via hole 222 respectively, and simplifying the forming of the tin block.

Certainly, the above is not limited. In other embodiments, the through hole may also be formed directly, and then the tin block matching the through hole in shape may be disposed in the through hole.

Further, forming the groove 221 by sinking from the front surface to the back surface of the outer pin 22 specifically refers to forming the groove 221 on the outer pin 22 by etching. Certainly, the present invention is not limited thereto.

As shown in FIG. 2 and FIG. 4(a), the lead frame 10 further includes a pin connecting rib 8 connecting the outer pins 22 in two adjacent lead frame units; and forming the groove 221 by sinking from the front surface to the back surface of the outer pin 22 specifically refers to forming the groove 221 by sinking from the front surface of the outer pin 22 and a front surface of the pin connecting rib 8 connected to the outer pin 22 to the back surface. After cutting is performed along the pin connecting rib 8, the side of the first tin block 3 in the groove 221 which is located on the cutting surface can be completely exposed.

Further, the grooves 221 on two opposing outer pins 22 in two adjacent lead frame units are communicated with each other, thereby simplifying the forming process of the groove 221 and the forming process of the first tin block 3 in the groove 221, and improving the efficiency.

Specifically, the groove 221 may be a rectangular groove 221 or an arc-shaped groove 221. Certainly, the specific shape of the groove 221 is not limited thereto and may be changed according to specific requirements.

In a specific embodiment, disposing the first tin block 3 in the groove 221 specifically refers to forming the first tin block 3 by reflowing solder paste after the groove 221 is filled with the solder paste. The solder paste is reflowed to be soldered with the lead frame 10 so as to form the first tin block 3 without affecting the strength of the lead frame 10 or the transfer of post-process operations. Certainly, the above is not limited. In other embodiments, the pre-formed tin block matching the groove 221 in shape may also be directly placed in the groove 221.

Particularly, specific parameters in the reflowing process may be parameters in the existing reflowing process, as long as the groove 221 can be filled with the solder paste and the first tin block 3 can be formed.

Figure 4B:
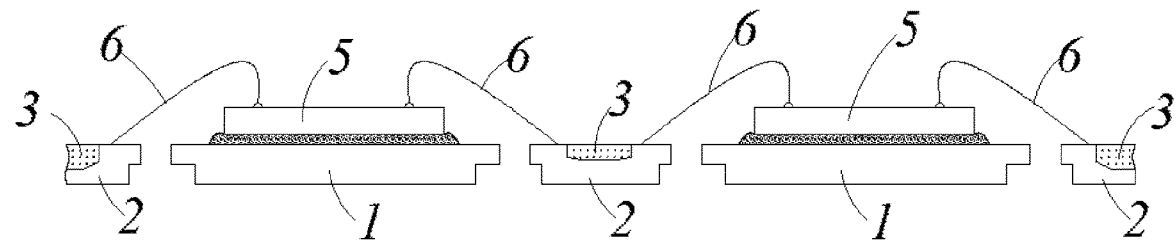
FIG. 4(b) is a section view of FIG. 4(a) at B-B.

As shown in FIG. 4(a) and FIG. 4(b), in this embodiment, mounting the chip 5 on the base island 1 of the lead frame 10 refers to mounting the chip 5 on the base island 1 with the solder paste. At this time, disposing the first tin block 3 in the groove 221 and mounting the chip 5 on the base island 1 of the lead frame 10 in the above steps specifically include:

filling the solder paste in the groove 221 while applying the solder paste on the base island 1; and reflowing the solder paste after mounting the chip 5 on the base island 1, and forming the first tin block 3 in the groove 221 while mounting the chip 5 on the base island 1.

That is, the base island 1 and the groove 221 are filled with the solder paste simultaneously, and then the solder paste is reflowed simultaneously, such that the first tin block 3 is formed in the groove 221 while the chip 5 is mounted on the base island 1, thereby simplifying the process and lowering the cost.

Certainly, the above is not limited. In other embodiments, disposing the first tin block 3 in the groove 221 and mounting the chip 5 on the base island 1 of the lead frame 10 in the above steps may also be completed separately. That is, the first tin block 3 may be firstly formed by reflowing the solder paste after the groove 221 is filled with the solder paste: and then, the chip 5 is mounted on the base island 1.

Further, forming the via hole 222 communicated with the groove 221 from the back surface of the outer pin 22 specifically refers to forming the via hole 222 communicated with the groove 221 from the back surface of the outer pin 22 by etching. Certainly, the present invention is not limited thereto.

Further, disposing the second tin block 4 in the via hole 222 specifically refers to forming the second tin block 4 by reflowing the solder paste after the via hole 222 is filled with the solder paste. The reflowing is performed to form the second tin block 4 soldered with the lead frame 10 and the first tin block 3 in the via hole 222 without affecting the strength of the lead frame 10 or the transfer of post-process operations.

It is known that, after the first tin block 3 is formed in the groove 221 through reflowing, the lead frame 10 is firstly plastic-packaged, and the formed plastic package 7 can close the opening of the groove 221. Subsequently, when the second tin block 4 is formed in the via hole 222 through reflowing, the melted first tin block 3 cannot flow out, thereby facilitating the forming of the second tin block 4.

Further, as shown in FIG. 8, after disposing the tin block in the through hole and before cutting the lead frame 10, the manufacturing method of the semiconductor packaging member 20 further includes the following step of: forming a semifinished product to be cut by forming a tin-plated layer 9 in an exposed region on a back surface of the lead frame 10. At this time, cutting the lead frame 10 to at least partially expose a side of the tin block located on the cutting surface refers to forming a single semiconductor packaging member 20 by cutting the semifinished product, a side of the tin block in the semiconductor packaging member 20 which is located on the cutting surface being at least partially exposed.

Specifically, after the tin-plated layer 9 is formed in the exposed region on the back surface of the lead frame 10, the first tin block 3 and the tin-plated layer 9 are connected by the second tin block 4.

As shown in FIG. 9, in this embodiment, in the semiconductor packaging member 20 formed by cutting, the side of the first tin block 3 which is located on the cutting surface is exposed. That is, since the via hole 222 is not cut during cutting, the heat on a cutter will not be transmitted to the second tin block 4 in the via hole 222, thereby avoiding the loss of the solder paste. Meanwhile, when the semiconductor packaging member 20 is soldered on the circuit board 30, after the tin block is melted, part of the melted first tin block 3 flows downward from the front surface of the outer pin 22 via the cutting surface to be aggregated with the tin-plated layer 9 on the back surface of the pin 2, and the remaining part of the melted tin block is aggregated with the tin-plated layer 9 on the back surface of the pin 2 along the via hole 222, such that all-position soldering from the front surface to side surfaces, the back surface, and the interior of the outer pin 22 is realized, thereby improving the reliability of the circuit, and effectively improving the stability and the pass rate in AOI detection.

Further, the via hole 222 is located between the groove 221 and the back surface of the outer pin 22. Thus, when cutting is performed along the pin connecting rib 8, whether to cut the via hole 222 may be selected according to requirements.

Further, in this embodiment, the via holes 222 in two opposing outer pins 22 in two adjacent lead frame units are not communicated with each other. Thus, whether to cut the via hole 222 may be selected according to requirements.

Specifically, specific parameters in the processes of performing wire bonding between the chip 5 and the inner pin 21, plastic-packaging the wire-bonded lead frame 10, and forming the tin-plated layer 9 in the exposed region on the back surface of the lead frame 10 in the manufacturing method of the semiconductor packaging member 20 of the present invention may follow the existing processes, and will not be repeated herein.

Further, as shown in FIG. 9, the present invention further provides a semiconductor packaging member 20 manufactured by the above manufacturing method. The manufacturing method of the semiconductor packaging member 20 is described above, and will not be repeated herein.

The semiconductor packaging member 20 includes a lead frame 10, the lead frame 10 is provided with a base island 1 and pins 2 located around the base island 1, and the pin 2 includes an inner pin 21 and an outer pin 22; and a through hole running through vertically is provided in the outer pin 22, the semiconductor packaging member 20 further includes a tin block disposed in the through hole, and a side of the tin block away from the inner pin 21 is at least partially exposed. It is known that the side of the tin block away from the inner pin 21 refers to the side of the tin block located on the cutting surface. In the semiconductor packaging member 20 of the present invention, the through hole is formed in the outer pin 22 of the lead frame 10, and the tin block is disposed in the through hole; and in addition, the side of the tin block located on the cutting surface is at least partially exposed after cutting. Subsequently, when the semiconductor packaging member 20 is soldered on the circuit board 30, the tin block is melted, and then, part of the melted tin block flows downward from the cutting surface to be aggregated with a tin-plated layer 9 on a back surface of the pin 2, and the remaining part of the melted tin block is aggregated with the tin-plated layer 9 on the back surface of the pin 2 along the through hole, such that all-position soldering from a front surface to side surfaces and a back surface, and even the interior of the outer pin 22 is realized, thereby improving the reliability of the circuit, and effectively improving the stability and the pass rate in AOI detection. Further, when the semiconductor packaging member 20 is soldered on the circuit board 30, the preset tin block can flow vertically to a pad of the circuit board 30 based on the principle of potential energy, thereby reducing power consumption and saving more energy.

Further, as shown in FIGS. 3, 4, 6 and 7, the through hole includes a groove 221 formed by sinking from the front surface to the back surface of the outer pin 22, and a via hole 222 communicating the groove 221 with the back surface of the outer pin 22; and the tin block includes a first tin block 3 located in the groove 221, and a second tin block 4 located in the via hole 222.

In this embodiment, the side of the first tin block 3 in the semiconductor packaging member 20 which is away from the inner pin 21 is exposed. When the semiconductor packaging member 20 is soldered on the circuit board 30, the tin block is melted, and then, part of the melted first tin block 3 flows downward from the front surface of the outer pin 22 via the cutting surface to be aggregated with the tin-plated layer 9 on the back surface of the pin 2, and the remaining part of the melted tin block is aggregated with the tin-plated layer 9 on the back surface of the pin 2 along the via hole 222, such that all-position soldering from the front surface to the side surfaces, the back surface and the interior of the outer pin 22 is realized, thereby improving the reliability of the circuit, and effectively improving the stability and the pass rate in AOI detection.

Further, the semiconductor packaging member 20 further includes a chip 5 mounted on the base island 1, a bonding wire 6 connected between the chip 5 and the inner pin 21, a plastic package body 7 for packaging the chip 5 and the bonding wire 6, and a tin-plated layer 9 formed on the back surface of the base island 1 and the back surface of the pin 2.

Further, the present invention further provides a mounting method of a semiconductor packaging member 20, including the following step of: soldering the above semiconductor packaging member 20 on a circuit board 30. During soldering, the tin block on the outer pin 22 is melted, part of the melted tin block on the side of the outer pin 22 away from the inner pin 21 is connected to the tin-plated layer 9 on the back surface of the outer pin 22, and the remaining part thereof is connected to the tin-plated layer 9 on the back surface of the outer pin 22 via the through hole. It is known that the tin block that is on the side of the outer pin 22 away from the inner pin 21 and connected to the tin-plated layer 9 on the back surface of the outer pin 22 can realize the all-position soldering from the front surface to the side surfaces and then the back surface of the pin 2, and the tin block connected to the tin-plated layer 9 on the back surface of the outer pin 22 via the through hole can realize all-position soldering between the interior of the pin 2 and the front surface and the back surface of the pin 2, thereby improving the reliability of the circuit, and effectively improving the stability and the pass rate in AOI detection.

Figure 10:
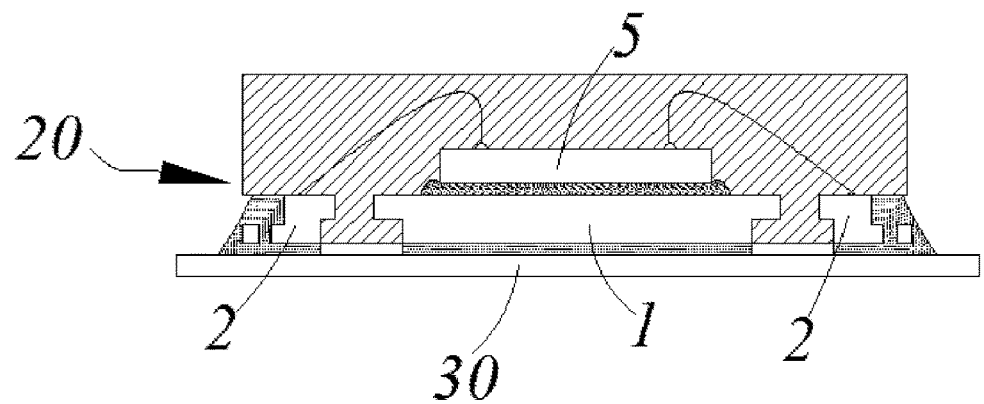
FIG. 10 is a section view of the semiconductor packaging member in FIG. 9 which has been installed onto a circuit board.

Specifically, as shown in FIG. 10, part of the melted first tin block 3 flows downward from the front surface of the outer pin 22 via the cutting surface to be aggregated with the tin-plated layer 9 on the back surface of the pin 2, and the remaining part of the melted tin block is aggregated with the tin-plated layer 9 on the back surface of the pin 2 along the via hole 222, such that all-position soldering from the front surface to the side surfaces, the back surface, and the interior of the outer pin 22 is realized, thereby improving the reliability of the circuit, and effectively improving the stability and the pass rate in AOI detection.

Figure 11:
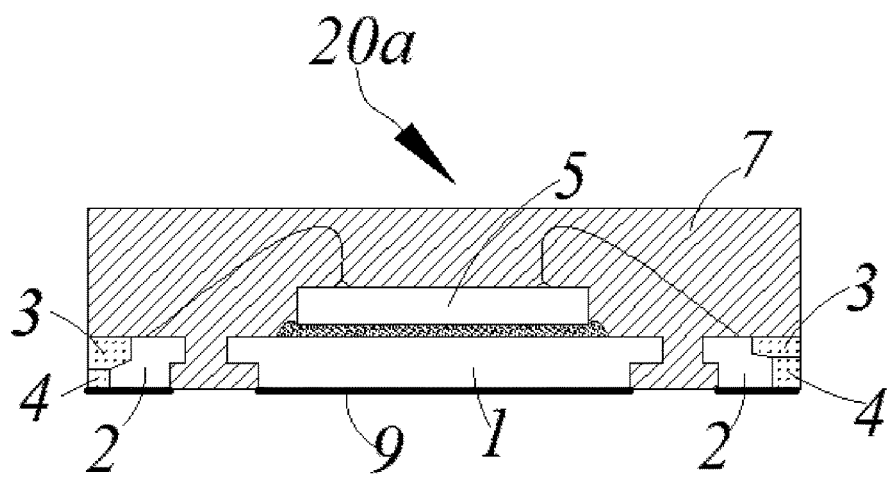
FIG. 11 is a section view of a semiconductor packaging member according to a second embodiment of the present invention formed by cutting the semifinished product in FIG. 8.

FIG. 11 shows a semiconductor packaging member 20*a* according to a second embodiment of the present invention. A manufacturing method of the semiconductor packaging member 20*a* according to the second embodiment is different from the manufacturing method of the semiconductor packaging member 20 according to the first embodiment in a cutting step. That is, in the semiconductor packaging member 20*a* formed after cutting, the side of each of the first tin block 3 and the second tin block 4 located on the cutting surface is exposed. In other words, since the via hole 222 is cut during cutting, the exposed area of the tin block on the cutting surface is increased. When the semiconductor packaging member 20*a* is soldered on a circuit board 30, all-position soldering from the front surface to the side surfaces and the back surface of the outer pin 22 is realized and a larger amount of tin can be plated on the side surfaces of the outer pin 22, thereby improving the reliability of the circuit, and effectively improving the stability and the pass rate in AOI detection.

It is known that, in the second embodiment in which the via hole 222 is to be cut, the via holes 222 on two opposing outer pins 22 in two adjacent lead frame units may also be communicated with each other. Certainly, the present invention is not limited thereto.

Except the cutting step, other steps in the manufacturing method of the semiconductor packaging member 20*a* according to the second embodiment of the present invention may refer to flowcharts of steps for manufacturing the semiconductor packaging member according to the first embodiment of the present invention, as shown in FIGS. 2 to 8.

Except the above difference, other parts in the second embodiment of the present invention are all same as those in the first embodiment of the present invention, which will not be repeated herein.

Correspondingly, as shown in FIG. 11, the semiconductor packaging member 20*a* manufactured by the manufacturing method according to the second embodiment of the present invention is different from the semiconductor packaging member 20 manufactured by the manufacturing method according to the first embodiment of the present invention in that, in the semiconductor packaging member 20*a*, the side of each of the first tin block 3 and the second tin block 4 away from the inner pin 21 is exposed. Therefore, the exposed area of the tin bock on the cutting surface can be increased, and a larger amount of tin can be plated on the side surfaces of the outer pin 22, thereby improving the reliability of the circuit, and effectively improving the stability and the pass rate in AOI detection.

Figure 12:
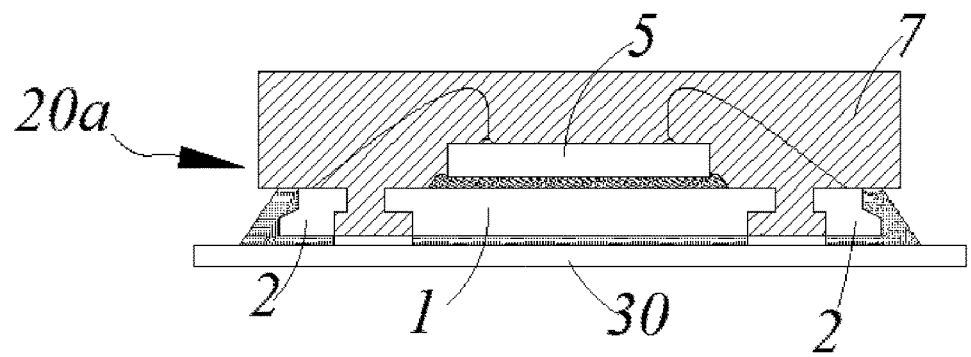
FIG. 12 is a section view of the semiconductor packaging member in FIG. 11 which has been installed onto a circuit board.

Correspondingly, as shown in FIG. 12, a mounting method of the semiconductor packaging member 20*a* includes the following step of: soldering the semiconductor packaging member 20*a* on a circuit board 30. During soldering, the tin block on the outer pin 22 is melted, part of the melted tin block on a side of the outer pin 22 away from the inner pin 2 is connected to a tin-plated layer 9 on a back surface of the outer pin 22, and the remaining part thereof is connected to the tin-plated layer 9 on the back surface of the outer pin 22 via the through hole.

Specifically, part of the melted tin block in the first tin block 3 and the second tin block 4 on a side of the outer pin 22 away from the inner pin 21 is connected to the tin-plated layer 9 on the back surface of the outer pin 22, and the remaining part thereof is connected to the tin-plated layer 9 on the back surface of the outer pin 22 via the via hole 222.

Compared with the prior art, in the manufacturing method of the semiconductor packaging member 20 or 20*a* of the present invention, the through hole is formed in the outer pin 22 of the lead frame 10, and the tin block is disposed in the through hole; and in addition, the side of the tin block located on the cutting surface is at least partially exposed after cutting. Subsequently, when the semiconductor packaging member 20 or 20*a* is soldered on the circuit board 30, the tin block is melted to realize all-position soldering from the front surface to the side surfaces, the back surface, and even the interior of the outer pin 22, thereby improving the reliability of the circuit, and effectively improving the stability and the pass rate in AOI detection.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments understandable by those skilled in the art.

A series of detailed descriptions listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A manufacturing method of a semiconductor packaging member, comprising the following steps of:
   forming a through hole running through vertically in an outer pin of a lead frame, and disposing a tin block in the through hole; and
   cutting the lead frame to at least partially expose a side of the tin block located on a cutting surface,
   wherein the through hole comprises a groove formed by sinking from a front surface to a back surface of the outer pin and a via hole communicating the groove with the back surface of the outer pin; the tin block comprises a first tin block located in the groove and a second tin block located in the via hole; and in the semiconductor packaging member, a side of the first tin block located on the cutting surface is exposed, or a side of each of the first tin block and the second tin block located on the cutting surface is exposed.

2. The manufacturing method of a semiconductor packaging member according to claim 1, wherein forming the through hole running through vertically in the outer pin of the lead frame, and disposing the tin block in the through hole specifically comprises the following steps of:
   forming the groove by sinking from the front surface to the back surface of the outer pin, and disposing the first tin block in the groove;
   mounting a chip on a base island of the lead frame, and performing wire bonding between the chip and an inner pin;
   plastic-packaging the wire-bonded lead frame; and
   forming the via hole communicated with the groove from the back surface of the outer pin, and disposing the second tin block in the via hole.

3. The manufacturing method of a semiconductor packaging member according to claim 2, wherein disposing the first tin block in the groove specifically refers to forming the first tin block by reflowing solder paste after the groove is filled with the solder paste.

4. The manufacturing method of a semiconductor packaging member according to claim 3, wherein mounting the chip on the base island of the lead frame refers to mounting the chip on the base island with the solder paste; and disposing the first tin block in the groove and mounting the chip on the base island of the lead frame specifically comprise:
filling the groove with the solder paste while applying the solder paste on the base island; and
reflowing the solder paste after mounting the chip on the base island, and forming the first tin block in the groove while mounting the chip on the base island.

5. The manufacturing method of a semiconductor packaging member according to claim 2, wherein disposing the second tin block in the via hole specifically refers to forming the second tin block by reflowing solder paste after the via hole is filled with the solder paste.

6. The manufacturing method of a semiconductor packaging member according to claim 2, wherein forming the groove by sinking from the front surface to the back surface of the outer pin specifically refers to forming the groove by sinking from the front surface of the outer pin and a front surface of a pin connecting rib connected to the outer pin to the back surface.

7. The manufacturing method of a semiconductor packaging member according to claim 6, wherein the grooves on two opposing outer pins in two adjacent lead frame units on the lead frame are communicated with each other.

8. The manufacturing method of a semiconductor packaging member according to claim 1, wherein the via hole is located between the groove and the back surface of the outer pin.

9. The manufacturing method of a semiconductor packaging member according to claim 1,
wherein the groove is a rectangular groove or an arc-shaped groove.

10. The manufacturing method of a semiconductor packaging member according to claim 1, wherein after disposing the tin block in the through hole and before cutting the lead frame, the manufacturing method of a semiconductor packaging member further comprises the following step of:
forming a semifinished product to be cut by forming a tin-plated layer in an exposed region on a back surface of the lead frame.

11. A semiconductor packaging member, comprising a lead frame, wherein the lead frame is provided with a base island and pins located around the base island, and the pin comprises an inner pin and an outer pin; and a through hole running through vertically is formed in the outer pin, the semiconductor packaging member further comprises a tin block disposed in the through hole, and a side of the tin block away from the inner pin is at least partially exposed,
wherein the through hole comprises a groove formed by sinking from a front surface to a back surface of the outer pin and a via hole communicating the groove with the back surface of the outer pin, and the tin block comprises a first tin block located in the groove and a second tin block located in the via hole; and in the semiconductor packaging member, a side of the first tin block away from the inner pin is exposed, or a side of each of the first tin block and the second tin block away from the inner pin is exposed.

12. The semiconductor packaging member according to claim 11, further comprising a chip mounted on the base island, a bonding wire connected between the chip and the inner pin, a plastic package body for packaging the chip and the bonding wire, and a tin-plated layer formed on the back surface of the base island and the back surface of the pin.

13. A mounting method of a semiconductor packaging member, comprising the following step of:
soldering the semiconductor packaging member according to claims 11 on a circuit board, wherein a tin block on an outer pin is melted during soldering, part of the melted tin block on a side of the outer pin away from an inner pin is connected to a tin-plated layer on a back surface of the outer pin, and the remaining part of the melted tin block is connected to the tin-plated layer on the back surface of the outer pin via the via hole.

* * * * *